(12) United States Patent
Packer Ali et al.

(10) Patent No.: US 7,454,673 B2
(45) Date of Patent: Nov. 18, 2008

(54) APPARATUS, SYSTEM, AND METHOD FOR ACCESSING PERSISTENT FILES IN NON-EXECUTE-IN-PLACE FLASH MEMORY

(75) Inventors: Dhamim Packer Ali, San Diego, CA (US); Jian Zhang, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 558 days.

(21) Appl. No.: 11/182,173

(22) Filed: Jul. 15, 2005

(65) Prior Publication Data

US 2007/0014136 A1 Jan. 18, 2007

(51) Int. Cl.
*G11C 29/22* (2006.01)
*G11C 29/46* (2006.01)
(52) U.S. Cl. ..................... 714/723; 714/730
(58) Field of Classification Search .......... None
See application file for complete search history.

(56) References Cited

U.S. PATENT DOCUMENTS 5,652,865 A * 7/1997 Rawlings, III .............. 711/171
2004/0193864 A1 9/2004 Tsai et al.

FOREIGN PATENT DOCUMENTS

EP 0424191 4/1991
EP 0507026 10/1992
EP 1115063 7/2001

OTHER PUBLICATIONS

International Search Report (ISR): PCT/ISA/220, 210 for International Application No. PCT/US2006/027271, ISR dated May 12, 2006, 6 pages.

* cited by examiner

*Primary Examiner*—Cynthia Britt
*Assistant Examiner*—Dipakkumar Gandhi

(57) ABSTRACT

Persistent files stored in non-XIP flash memory are accessed during operation of an electronic device. During execution of application code on the device, the persistent files are accessed using an access directory such as a look-up table. The access directory provides information that allows an application or other software code running on the processor of the device to locate and access a persistent file within a non-XIP flash memory device where the non-XIP flash memory device may include bad blocks. During creation of the access directory, locations of the bad blocks in the device are identified and recorded. Files are accessed from the non-XIP flash memory device by reading from file start locations identified in the access directory while accounting for bad blocks identified in the bad block data of the access directory.

20 Claims, 6 Drawing Sheets

APPARATUS, SYSTEM, AND METHOD FOR ACCESSING PERSISTENT FILES IN NON-EXECUTE-IN-PLACE FLASH MEMORY

FIELD OF THE INVENTION

The invention relates in general to memory devices and more specifically to an apparatus, system and method for accessing persistent files in non-execute-in-place flash memory.

BACKGROUND OF THE INVENTION

Firmware and persistent files facilitate the operation of portable electronic devices such as cellular telephones and personal digital assistants. The persistent files typically include non-volatile data defining default content and data needed for general system operation of the device. Examples of persistent files include font files, language support files, and default multimedia content such as sounds, pictures and videos. In conventional devices, the firmware and persistent files are stored in non-volatile memory, non-execute-in-place (non-XIP), such as a NAND flash memory device, and are copied to an execute in place (XIP) memory device, such as RAM (random access memory) or SDRAM (synchronous dynamic random access memory). As the functionality and complexity of portable electronic devices increases, the memory required for persistent files and firmware also increases. In addition to increased functionality, industry competition and consumer demands require manufacturing costs for portable devices to continually decrease. In conventional devices, the persistent files can not be directly accessed when in the non-XIP flash memory. As a result, conventional devices are limited in that the XIP memory device within a portable electronic device must have sufficient capacity for the executable code and persistent files copied from the non-XIP flash memory.

Accordingly, there is need for an apparatus, system, and method for accessing persistent files stored in non-XIP flash memory.

SUMMARY OF THE INVENTION

In accordance with an exemplary embodiment of the invention, persistent files stored in non-XIP flash memory are accessed during operation of an electronic device. During execution of application code on the device, the persistent files are accessed using an access directory such as a look-up table. The access directory provides information that allows an application or other software code running on the processor of the device to locate and access a persistent file within a non-XIP flash memory device where the non-XIP flash memory device may include bad blocks. During creation of the access directory, locations of the bad blocks in the device are identified and recorded. Files are accessed from the non-XIP flash memory device by reading from file start locations identified in the access directory while accounting for bad blocks identified in the bad block data of the access directory. Therefore, persistent files can remain stored in the non-XIP flash memory device, such as a NAND device, and are not copied into an XIP memory device such as a SDRAM device. The required size of the XIP memory device is minimized thereby reducing manufacturing costs of the electronic device.

DETAILED DESCRIPTION OF THE INVENTION

Figure 1:
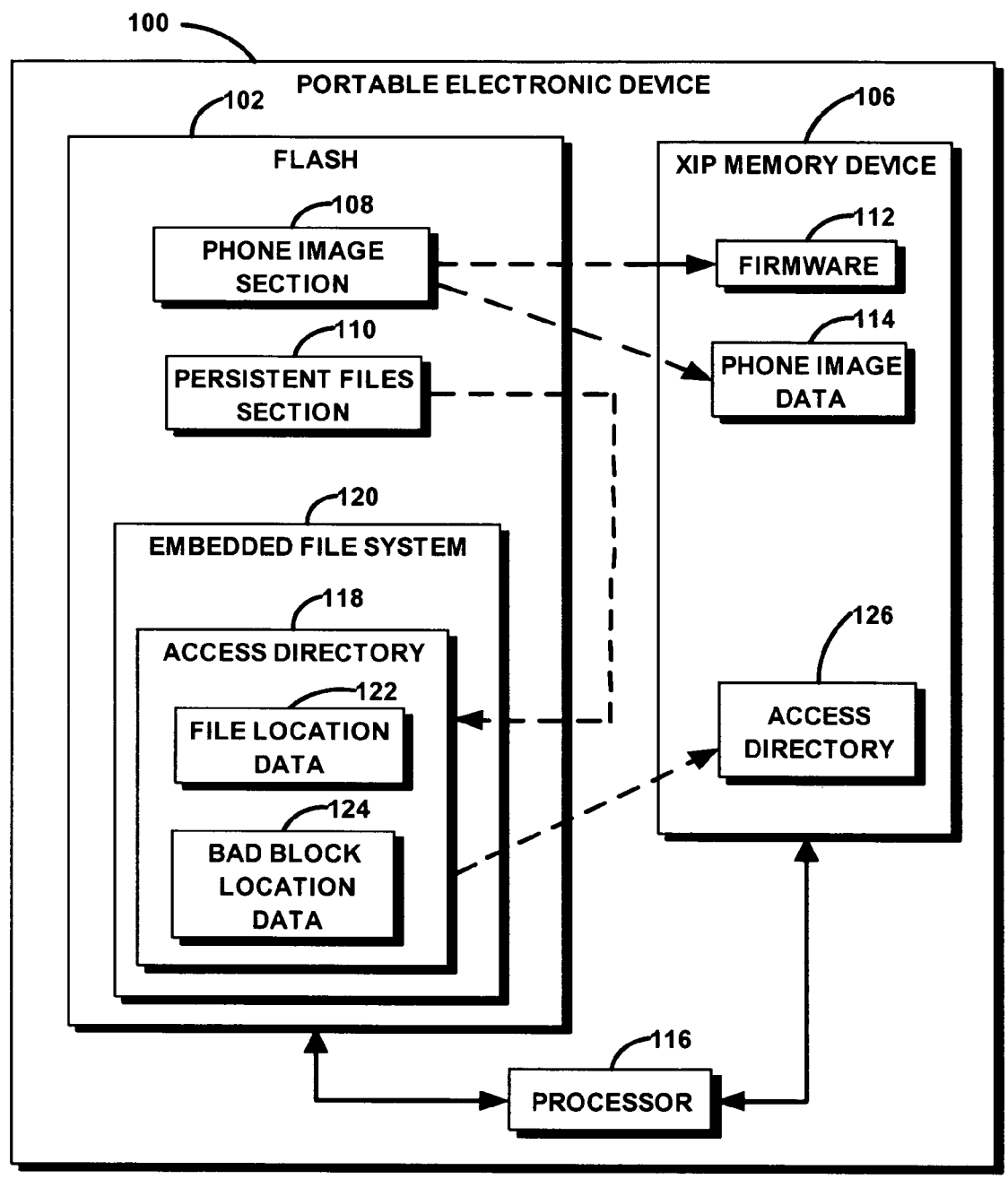
FIG. 1 is a block diagram of a portable electronic device in accordance with an exemplary embodiment of the invention.

FIG. 1 is a block diagram of portable electronic device 100 in accordance with an exemplary embodiment of the invention. The various functions depicted in FIG. 1 may be performed by any combination of hardware, software and firmware. Any function described as performed by a single block may be performed by multiple devices or systems and the functions of more than one block may be performed by a single device.

Portable electronic device 100 is any device that at least includes non-XIP flash memory device 102, execution-in-place (XIP) memory device 104 and persistent files that facilitate operation of the portable electronic device 100. In the exemplary embodiment, portable electronic device 100 is a cellular telephone where non-XIP flash memory device 102 is a NAND flash memory device and execution in place (XIP) memory device 106 is a SDRAM device. Before device 100 is placed into service, persistent files and phone image files are copied to non-XIP flash memory device 102. In the exemplary embodiment, the phone image files are in a compressed format while the persistent files remain uncompressed when loaded into non-XIP flash memory device 102. As part of the manufacturing process of portable device 100 or after an update, the phone image code and the persistent files are loaded into appropriate sections 108, 110 of non-XIP flash memory device 102. During the loading process, bad blocks are identified and avoided. Accordingly, the location of persistent files section 110 may depend on the location of the bad blocks within non-XIP flash memory device 102. In the exemplary embodiment, a persistent file marker is loaded at the beginning of persistent files section 110 to provide information on the location of persistent files section 110. In the exemplary embodiment, a pad is inserted after the phone image code to reserve space in the phone image section 108 and allow for future code expansion and to maintain a consistent start location for persistent files section 110. Accordingly, the persistent file marker is located at the intended start location of the persistent files section where the specific location depends on the existence and number of bad blocks.

During a power-up procedure of portable device 100, the phone image files are decompressed and copied to XIP memory device 106 to form firmware code 112 and phone image data 114. Processor 116 executes the firmware code from XIP memory device 106 to perform functions that facilitate the overall functionality of the portable device. The XIP memory device 106 is any storage device, such as a RAM device or a flash device, for example, that facilitates the execution of code. An example of a suitable RAM device is SDRAM device. In some situations, a flash device such as a NOR flash device may be used for the XIP memory device 106. In addition to other functions, firmware code 112 performs a persistent file initialization procedure during the first power-up procedure after the phone image and persistent files have been installed or updated. The persistent file initialization procedure establishes access directory 118 for accessing the persistent files within non-XIP flash memory device 102. In the exemplary embodiment, access directory 118 is stored in embedded files system (EFS) section 120 of NAND flash memory device 102 and is loaded into XIP memory device 106 during subsequent power up procedures as RAM access directory 126. If the phone image and persistent files are changed by a new code version, the persistent file initialization procedure is performed at the next device power-up to establish a revision of access directory 118.

Access directory 118 includes file location data 122 and bad block location data 124 where file location data 122 indicates locations of persistent files within persistent file section 110 of non-XIP flash memory device 102 and the bad block data indicates the bad block locations within persistent file section 110. As discussed below in further detail, the persistent file initialization procedure determines the start location of each file and the location of each bad block in persistent file section 110 to form access directory 118. In general, the location of the persistent file section is identified, the size of each persistent file is determined, and persistent file section 118 is scanned for each persistent file while checking the block boundaries for bad blocks.

The access directory is copied to XIP memory device 106 to facilitate access to access directory 118 by firmware 112 running on processor 116. An access procedure is invoked to access the persistent files using access directory 118. The access procedure is discussed in further detail below with reference to FIG. 5 and FIG. 6. In general, a start page and offset for a persistent file is determined from the access directory, the file is read from the offset while bad blocks are skipped. Bad blocks are identified by page number in a bad block table of bad block location data 124. Bad block indexes provide additional efficiency by pointing to the first bad block page encountered when reading the file.

In some circumstances, persistent files section 110 may be stored in EFS 120. In the exemplary embodiment, however, the persistent files are stored outside of EFS 120 minimizing the number of files that are managed by EFS 120. Since the persistent files are not repeatedly moved and re-written in EFS 120, the life of non-XIP flash device 102 is maximized.

Figure 2:
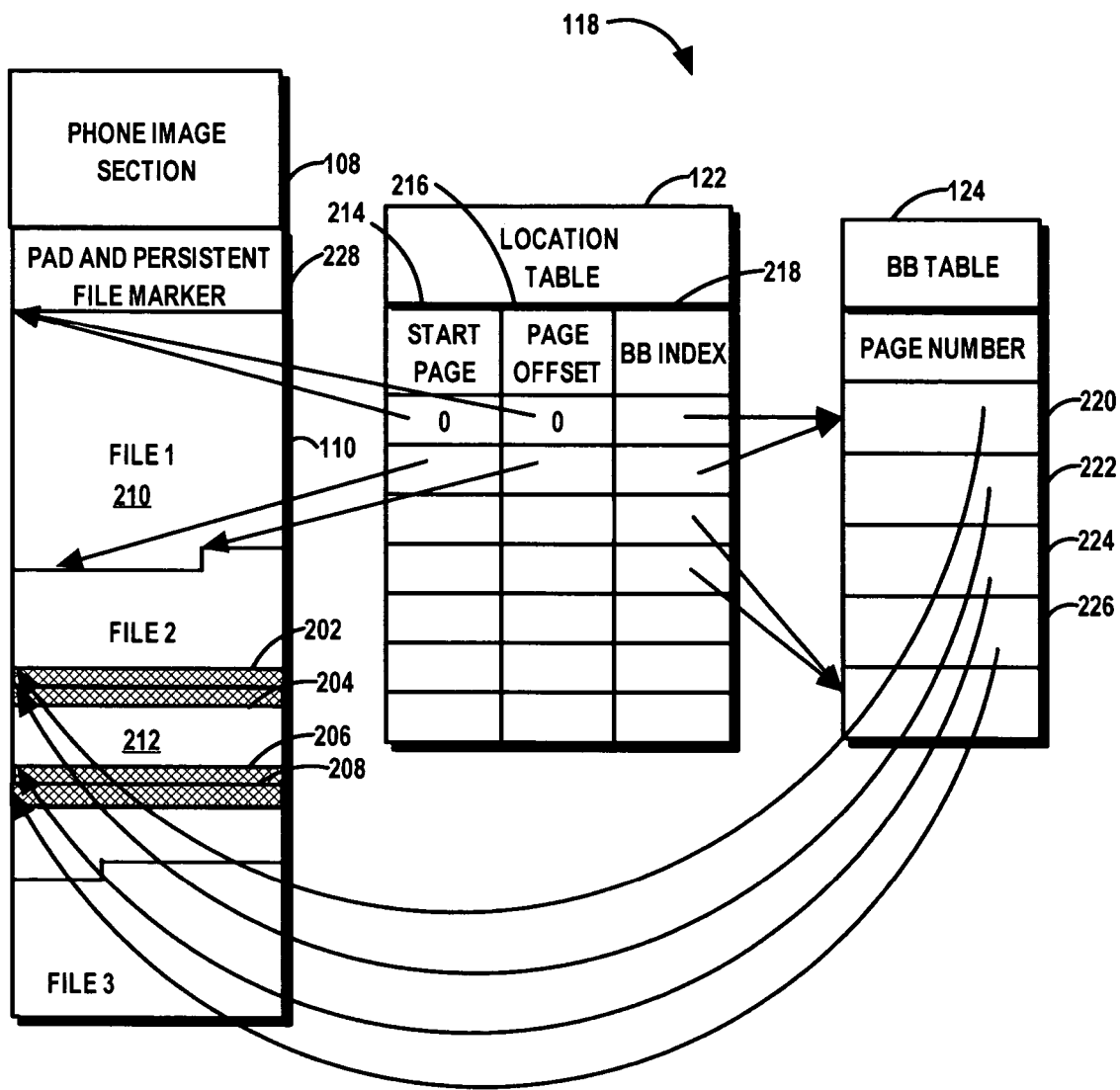
FIG. 2 is a block diagram illustrating an exemplary relationship between the access directory and the persistent files section where the file location data includes a location table and where the bad block data includes a bad block table.

FIG. 2 is a block diagram illustrating an exemplary relationship between access directory 118 and persistent files section 110 where file location data 122 includes a location table and where bad block data 124 includes a bad block table. As discussed above, NAND memory devices often contain invalid or "bad blocks". Bad blocks are blocks that contain one or more invalid bits whose reliability is not guaranteed. Bad blocks may be present when the device is shipped or may develop during the lifetime of the device. The location table and the bad block table are created during an access directory initialization procedure by locating the persistent files section, scanning non-XIP flash memory device 102 for each persistent file, and recording the location of each persistent file as well as all bad blocks that are encountered during the scan. Bad block table 124 includes page numbers of the start page for each bad block within persistent files section 110. NAND devices are shipped with bad block information indicating the bad blocks with the device. Typically, locations within a spare bytes section of the first page and a spare bytes section of the second page of each block are reserved for bad block information that indicates whether the block is bad. During the access directory initialization procedure, the bad blocks are identified using the bad block information in the spare bytes section and used to create bad block table 124. The access directory initialization procedure is discussed in further detail with reference to FIG. 3 and FIG. 4 below.

In the exemplary embodiment, location table 122 is lookup table that includes start location and bad block index 218 for each persistent file. The start location includes start page 214 and page offset 216 where start page 214 indicates page number and page offset 216 indicates the byte offset within that page where the file begins. Bad block index 218 indicates the location within bad block table 124 containing page number 220, 222, 224 and 226 of the first bad block that is encountered when serially accessing the file. Accordingly, if bad block index 218 for a file is the same as bad block index 218 for the next file, the file does not contain any bad blocks.

In the exemplary situation discussed with reference to FIG. 2, the persistent files section includes plurality of bad blocks 202, 204, 206 and 208 and plurality of persistent files 210, 212. Location table 122 includes start page 214, page offset 216, and bad block index 218 for each persistent file 210, 212. Bad block index 218 points to a location 220, 222, 224 and 226 of bad block table 124 that includes the page number of the bad block that is first encountered when the file is serially accessed. For example, first bad block index 218 points to first location 220 in the bad block table where the page number listed corresponds to first bad block 202 in the persistent files section when "FILE 2" 212 is read. The next location in bad block table 222 contains the page number of the first page of next bad block 204. Accordingly, several bad block indexes 218 may point to a single bad block location 220. As discussed above, where current file has the same bad block index as the previous file, current file 210 does not include any bad blocks 202, 204, 206 and 208.

Figure 3:
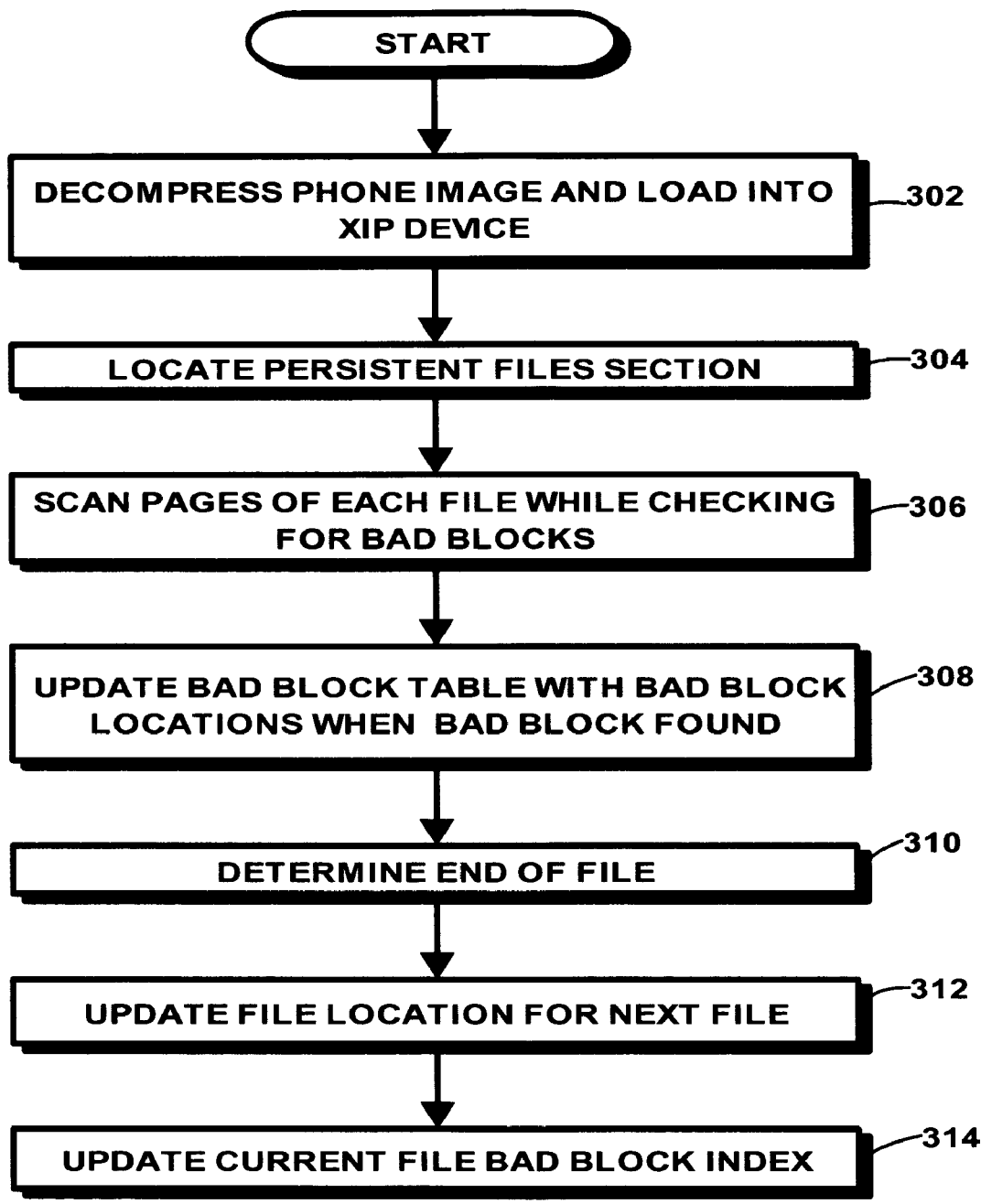
FIG. 3 is a flow chart of a method of performing an access directory initialization procedure in accordance with the exemplary embodiment of the invention.

FIG. 3 is a flow chart of a method of performing an access directory initialization procedure in accordance with the exemplary embodiment of the invention. The access directory initialization procedure is performed by the execution of the firmware code by processor 116 during the first power-up sequence of portable device 100 after the phone image and the persistent files have been initially loaded or updated. Although the method can be performed in any situation where persistent files are stored on a non-XIP flash memory device 102, the exemplary method is performed within a portable cellular telephone.

At step 302, the phone image section is decompressed and loaded into XIP device 106. As explained above, phone image section 108 is compressed when loaded into non-XIP flash memory device 102 in the exemplary embodiment. Accordingly, the phone image section 108 is decompressed and loaded into XIP device 106 so it can be executed by processor 116 as firmware code 112. In addition to other firmware and data, firmware code 112 includes the access directory initialization code and persistent files access code in the exemplary embodiment. Steps 304 through 314 discussed below provide an exemplary method for performing the access directory initialization procedure.

At step 304, persistent files section 220 is located within non-XIP flash memory device 102. As discussed above, persistent files section 220 is separated from phone image section 108 by a pad and persistent files marker 228 in the exemplary embodiment. Since persistent files section 110 is positioned immediately after persistent files marker 228, persistent files section 110 is located by identifying persistent file marker 228. Accordingly, non-XIP flash memory device 102 is searched for persistent files marker 228 from the end of the pad and the anticipated start location of persistent files section 110. Persistent files marker 228, therefore, provides specific identification of persistent files section 110 where bad blocks may be present.

At step 306, persistent files section 110 is scanned while checking for bad blocks. The bad block indicator location within the first page of a block is read to determine if the block is a bad block (invalid). Each file is scanned by calculating the file size based on the information stored in phone image data 114 and reading the file from the start location until all of the data of the file is scanned. The block boundaries encountered while the file is read are evaluated to determine if the block is a bad block.

At step 308, the bad block table is updated with the bad block locations when a bad block is found. Portions of file that spans more than one block may be separated by one or more bad blocks. When the bad blocks are identified, bad block table 124 in access directory 118 is updated by listing the bad block pages.

At step 310, the file end of the currently scanned file is determined. When the number of bytes read for the particular file is equal to the length of the file, it is determined that the file end has been reached.

At step 312, the file location data in access directory 118 is updated to reflect the start location of the next file. In the exemplary embodiment, the data is four bytes aligned and the file start location of the next file is the next available full four byte section. The start page and the offset of the next file are entered into location table 122.

At step 314, bad block index 218 for the next file is updated in the location table 122 of access directory 118. As discussed above, bad block index 218 points to the page number location (220, 222, 224 and 226) in bad block table 124 of the first bad block that is encountered when reading the current file. If no bad blocks are found while scanning the file, the bad block index of the current file is the same as the last bad block index.

Figure 4:
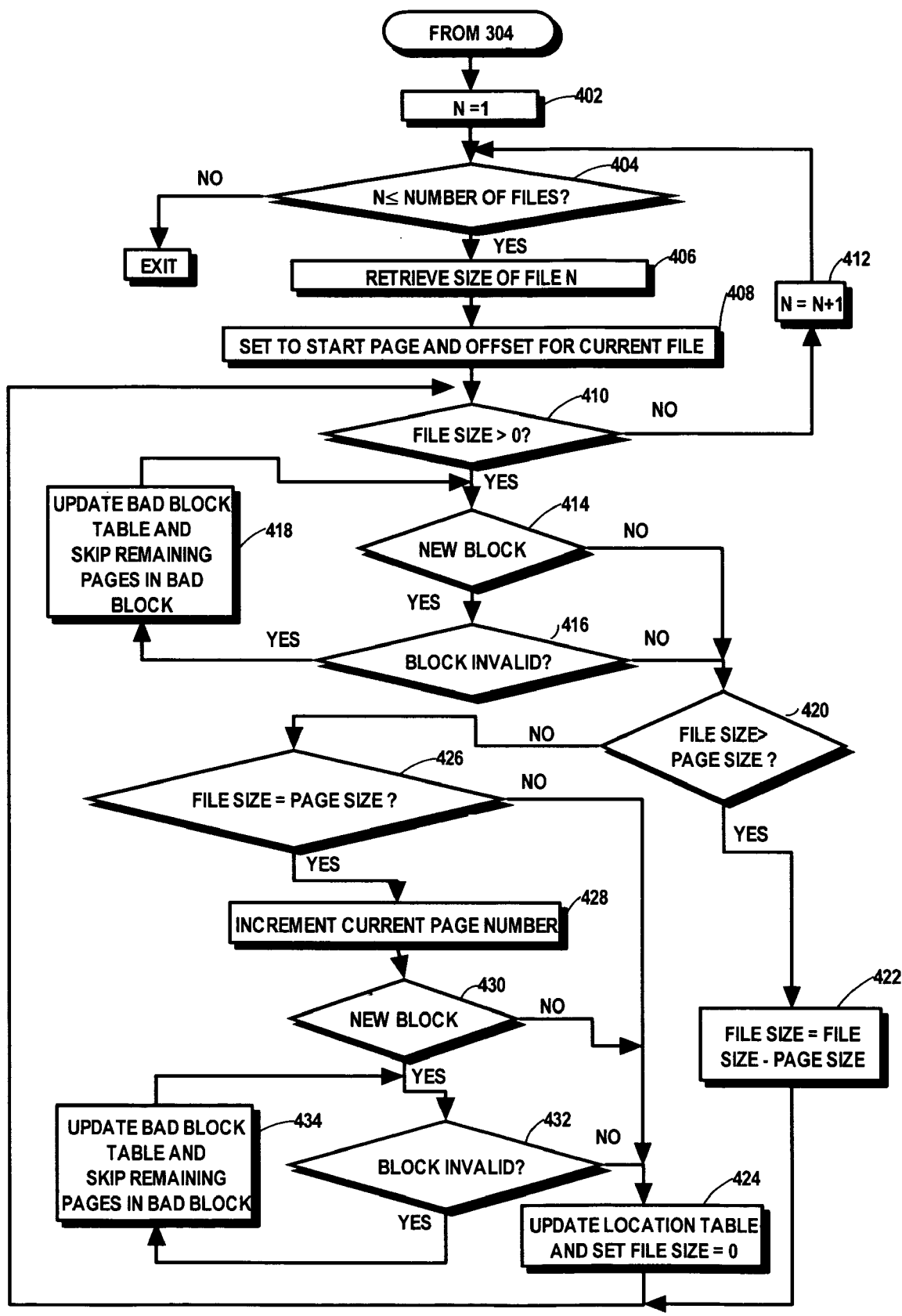
FIG. 4 is a flow chart of an exemplary method of performing steps 306 through 314 of FIG. 3.

FIG. 4 is a flow chart of the exemplary method of performing steps 306 through 314 of FIG. 3. The functions and procedures described with reference FIG. 4 may be performed in any order or simultaneously to execute steps 306-314 in FIG. 3. The procedures of any step described with reference to FIG. 4 may perform portions of multiple steps in FIG. 3 and any single step in FIG. 3 may be performed by multiple steps in FIG. 4. Accordingly, the steps in FIG. 4 do not necessarily directly correspond to a step in FIG. 3.

At step 402, a counter (N) is set equal to "1".

At step 404, it is determined whether N is less than or equal to the number of persistent files stored in non-XIP flash memory device 102. When N is less than the number of files, the procedure continues at step 406. Otherwise, the procedure is terminated by exiting. Accordingly, the procedure exits when the number of files is less than N indicating that there are no more files to scan.

At step 406, the size of file N is retrieved. Based on the metadata included in the phone image, the size of the current file is determined. The phone image, therefore, includes the sizes of the persistent files.

At step 408, the start page for the current file is set. Based on the file size, the start page and start offset is determined for the current file. Scanning begins at the start location.

At step 410, it is determined whether the file size is greater than 0. If the file size is not greater than zero, the procedure continues to step 412 where N is incremented by one before returning to step 404. Otherwise the procedure continues at step 414. As discussed below, the file size is decremented by the page size after a page is scanned. Therefore, it is determined at step 410 whether there are additional pages to be scanned for the current file.

At step 414, it is determined whether a new block has been reached. In the exemplary embodiment, it is determined whether a block boundary has been reached based on whether the page number within the block divided by 32 results in a remainder (i.e. Page % 32=0). Since there are 32 pages in a block, the result is zero only at a block boundary. If a new block is not encountered, the procedure continues at step 420. If a block boundary is reached, the procedure continues at step 416.

At step 416, it is determined whether the block is invalid (i.e. the block is a bad block). The bad block information in the spare bytes corresponding to the first page and second page of the block is read. If the block is a valid block, the procedure continues at step 420. If the bad block information indicates the block is invalid (i.e. the block is bad block), the procedure proceeds to step 418.

At step 418, the remaining pages in the block are skipped and the bad block table is updated with the page number of the bad block. The procedure then returns to step 414.

At step 420, it is determined whether the file size is greater than the page size. If the file size is greater than the page size, then more than one page of data remains for the file. The file size is decremented by the size of a page at step 422 and the procedure returns to step 410 to continue the scan of the file. If the file size is not greater than the page size, the procedure continues at step 426.

At step 426, it is determine whether the file size is equal to the page size. If the file size is equal to the page size, the procedure continues at step 428. Otherwise the procedure continues at step 424.

At step 424, the location table 122 is updated and the file size is set equal to zero. Start location 214, 216 of the next file is determined by location of the end of the current file and any aligning that is required. Therefore, page 214 and offset 216 values in table 122 are updated to reflect the start location of the next file. In addition, bad block index 218 is updated to point to the next location of the bad block table. Where no bad block has been encountered, the next bad block index 218 is the same as the current bad block index 218. The procedure then returns to step 410.

At step 428, the current page number is incremented by one. Therefore, if it is determined that the file size is equal to the page size in step 426, the page number is incremented and the procedure continues at step 430.

At step 430, it is determined whether a new block has been encountered. If a block boundary has been reached, the procedure continues to step 432. Otherwise, the procedure continues to step 424.

At step 432, it is determined if the block is invalid. If the block is valid and not a bad block, the procedure continues at step 424. Otherwise the procedure continues at step 434 where bad block table 124 is updated and the remaining pages in the bad block are skipped.

Figure 5:
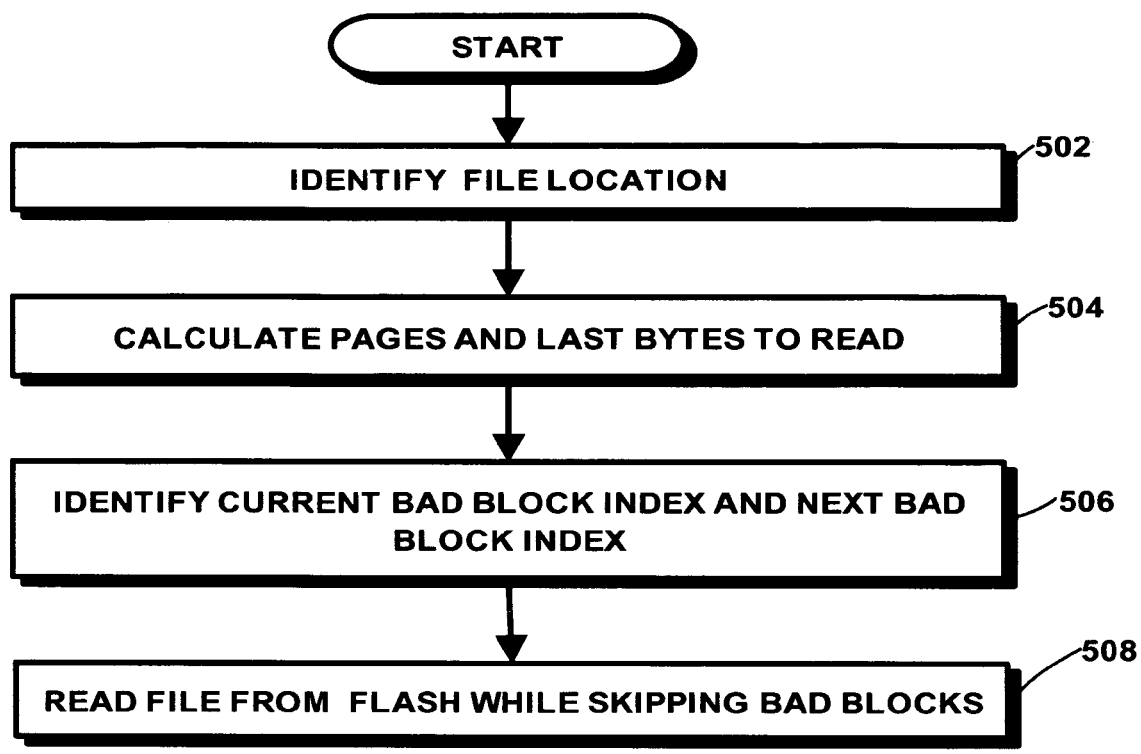
FIG. 5 is a flow chart of a method of accessing persistent files in accordance with the exemplary embodiment of the invention.

FIG. 5 is flow chart of a method of accessing persistent files in accordance with the exemplary embodiment of the invention. Although the method can be performed in any situation where files are stored on non-XIP flash memory device 102, the exemplary method is performed within a portable cellular telephone. Two or more steps may performed simultaneously and the order of the steps may be changed in some situations.

At step 502, the file location of the file to be read from non-XIP flash memory device 102 is identified. In the exemplary embodiment, the file location is determined from access directory 118. Start page 214 and offset 216 of the file is retrieved from location table 122 of access directory 118.

At step 504, the number of pages and number of bytes to be read are calculated for the file. Based on the length of the file requested to be read, the number of pages and bytes are calculated.

At step 506, the bad block data is retrieved. The bad block data stored in the access directory 118 is retrieved. In the exemplary embodiment, bad block data is read from location table 122 and bad block table 124. The current bad block index and the next bad block index are read from location table 218 of the access directory 118. When the current bad block index 218 is not the same as the next bad block index 218, the bad block page, or pages, corresponding to the current file are read from the bad block table.

At step 508, the file is read from non-XIP flash memory device 102 by skipping bad blocks. The calculated number of pages and bytes are read from non-XIP flash memory device 102 while accounting for any bad blocks. An exemplary method for reading the file is discussed below with reference to FIG. 6.

Figure 6:
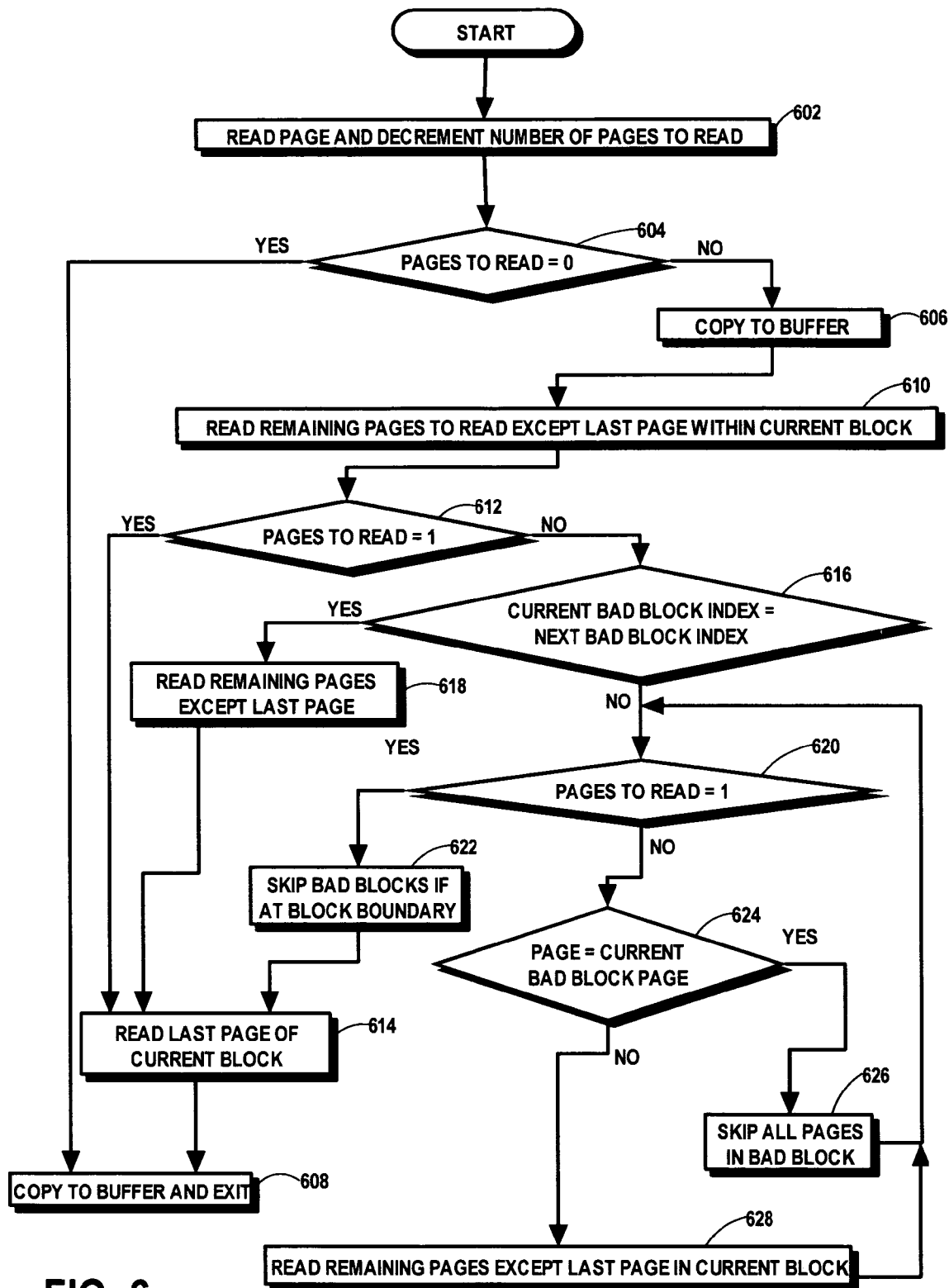
FIG. 6 is a flow chart of a method of reading a persistent file from the non-XIP flash memory device.

FIG. 6 is a flow chart of a method of reading a persistent file from non-XIP flash memory device 102. Therefore, the method described with reference to FIG. 6 is an exemplary method of performing step 508 of FIG. 5. The functions and procedures described with reference FIG. 6 may be performed in any order or simultaneously to execute step 508 of FIG. 5.

At step 602, the first page of the file is read from non-XIP flash memory device 102 and the number of pages to read is decremented by one. Depending on the offset and the length of the file, either an entire page may be read or only a portion of the page may be read.

At step 604, it is determined whether the number of pages to read is equal to zero. If no pages are left to be read and the number of pages is equal to zero, the method continues to step 608 where the data for the file is copied to a buffer and the procedure concludes. If there are more pages to read (i.e., the number of pages to read is not equal to zero), the method continues at step 606 where the data for the file is copied to the buffer.

At step 610, the remaining pages to read, except for the last page, are read from the current block.

At step 612, it is determined whether the number of pages to read is equal to one. If the remaining data for the file requires reading one page or a portion of a page, the method continues at step 614 where the last page of the current block is read and the method exits. Otherwise, the method continues to step 616. Therefore, if the data for the file requires reading more than one page, the method continues at step 616. Accordingly, the remainder of the procedure starting at step 616 is not required to be performed where a block boundary will not be crossed. Where the remainder of the file is within the current block, the file can be read without checking for bad blocks.

At step 616, it is determined if the current bad block index 218 is the same as the next bad block index 218. If the indexes are the same, the procedure continues at step 618. When the indexes are the same, there are no bad blocks in the current block and the remaining data of the file is read at steps 618 and 614. If the indexes are not the same, the method continues at step 620.

At step 620, it is determined if the remaining data of the file requires reading one page. Accordingly, it is determined if more than one page must be accessed to read the remaining data pertaining to the file being read. If only one page or portion of a page is to be read, the procedure continues at step 622. Otherwise, the procedure continues at step 624.

At step 622, the bad blocks are skipped if a bad block is reached. At step 622, the data to be read is one page or less. It is still possible, however, that the final page to be read may be after one or more bad blocks. Accordingly, if the last page to be read is at a block boundary (i.e. first page of a block), the bad block information for the page is compared to bad block page 220, 222, 224 and 226 in bad block table 124. If the block is bad, the next block is checked until a valid block is found. The last page or portion of page is read and copied to the buffer.

At step 624, it is determined if the page is the current bad block page. The page is compared to the bad block page numbers in the bad block table. If the bock is invalid, the remaining pages in the block are skipped at step 626 and the procedure returns to step 620 to determine the number of pages left to read. If the block is valid, the procedure continues at step 628.

At step 628, the remaining pages except for the last page in the current block are read. The procedure then returns to step 620. Accordingly, steps 620, 624, 626, and 628 form a loop than reads pages while skipping bad blocks. The loop is exited when a single page is left to be read.

In accordance with the exemplary embodiment, therefore, a compressed phone image and non-compressed persistent files are loaded or updated into NAND flash memory device 102 of a portable cellular telephone or other electronic portable device 100. During an access directory initialization procedure, during a power-up sequence, the persistent files are scanned while checking the block boundaries for bad blocks. An access directory is created having location table 122 and bad block table 124 where location table 122 includes the start page and offset for each file and a bad block index. Bad block table 124 includes page numbers 220, 222, 224 and 226 of the bad blocks within persistent files section 110. During operation of portable electronic device 100, the persistent files are accessed on non-XIP flash memory device 102 using an access procedure that accounts for the bad blocks in persistent files section 110. Bad blocks indicated in access directory 118 are skipped while reading the files form the persistent files section. Since the files can be accessed directly from NAND flash memory device 102, the size and cost of XIP memory device 106 is reduced.

From the above description of exemplary embodiments of the invention, it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

What is claimed is:

1. A non-volatile non-XIP flash memory device comprising:
    a persistent file section for storing persistent files that can be accessed without copying the persistent files to another memory device; and
    an access directory comprising:
        file location data indicating locations of persistent files within the persistent file section; and bad block data indicating bad block locations within the persistent file section.

2. A non-volatile non-XIP flash memory device in accordance with claim 1, wherein the persistent file section comprises a plurality of blocks comprising the bad blocks.

3. A non-volatile non-XIP flash memory device in accordance with claim 2, wherein the file location data comprises a page number and an offset value for each persistent file.

4. A non-volatile non-XIP flash memory device in accordance with claim 3, wherein the bad block data comprises a bad block table comprising at least one bad block page number corresponding to a first page of a bad block.

5. A non-volatile non-XIP flash memory device in accordance with claim 4, wherein the bad block data further comprises a bad block index comprising a plurality of bad block index values corresponding to the plurality of persistent files and indicating a location within the bad block table containing a first bad block page number of a first bad block encountered for each persistent file when the persistent file is read from the non-volatile non-XIP flash memory device.

6. A non-volatile non-XIP flash memory device in accordance with claim 1 wherein the access directory is a look-up table comprising a plurality of file locations, each file location corresponding to a persistent file and comprising a page number and an offset value corresponding to a starting point of the persistent file.

7. A non-volatile non-XIP flash memory device in accordance with claim 1 wherein the access directory is formed during a initialization procedure of an electronic device utilizing the non-volatile non-XIP flash memory device and is stored in an embedded file system portion of the non-volatile non-XIP flash memory device.

8. A non-volatile non-XIP flash memory device in accordance with claim 1, wherein the access directory is configured to be used during operation of the electronic device to provide access to the persistent files.

9. A method of accessing persistent files stored within a persistent file section of a non-volatile non-XIP flash memory device, the method comprising:
   determining a file location of a persistent file within the persistent file section based on file location data within an access directory;
   reading the persistent file from the non-volatile non-XIP flash memory device from the file location while skipping bad blocks indicated by bad block data in the access directory and without copying the persistent file to another memory device.

10. A method in accordance with claim 9, wherein the reading comprises:
   comparing current pages of the non-XIP flash memory device to bad block page numbers within a bad block table of the access directory; and
   reading the persistent files while skipping the bad blocks indicated by the bad block page numbers.

11. A method in accordance with claim 10, wherein the reading comprises:
   determining if a current bad block index corresponding to the persistent file is the same as a next bad block index corresponding to a next persistent file, each bad block index indicating a location within the bad block table containing a first bad block page number of a first bad block encountered for each persistent file when the persistent file is read from the non-volatile non-XIP flash memory device; and
   reading the persistent file if the current bad block index is the same as the next bad block index, the access directory comprising the current bad block index and the next bad block index.

12. A method in accordance with claim 11, wherein the reading comprises:
   skipping remaining pages of a current block if a current page number is the same as a current bad block page number corresponding to the persistent file.

13. A method in accordance with claim 12, the reading further comprising:
   reading the remaining pages of the current block except for the last page in the current block if the current page is not the same as the current bad block page number.

14. A method in accordance with claim 13, the reading further comprising:
   reading data within the last page of the persistent file while skipping bad blocks indicated by the bad block table.

15. A method of initializing a portable device comprising a non-XIP flash memory device and an execute-in-place (XIP) memory device, the method comprising:
   locating a persistent files section within a non-XIP flash memory device, the persistent files section storing a plurality of persistent files that can be accessed without copying the persistent files to another memory device;
   scanning the pages of each persistent file while checking for bad blocks; and
   storing bad block information within an access directory indicating a location of bad blocks within the persistent files section.

16. A method in accordance with claim 15, wherein the scanning comprises:
   determining a starting location for the persistent file;
   retrieving a size of the persistent file; and
   determining if a block is valid when a new block is encountered while scanning the persistent file.

17. A method in accordance with claim 16, wherein the storing comprises:
   storing a page and offset value indicating the starting location of each persistent file; and
   storing bad block page numbers in a bad block table of the access directory, the bad block page numbers indicating locations of bad blocks in the non-XIP flash memory device.

18. A method in accordance with claim 17, further comprising:
   storing a bad block index corresponding to each persistent file, each bad block index indicating a location within the bad block table containing a first bad block page number of a first bad block encountered for each persistent file when the persistent file is read from the non-XIP flash memory device.

19. A cellular telephone comprising:
   a non-volatile non-XIP flash memory device comprising a phone image section, a persistent files section, and an access directory; and
   an execute-in-place (XIP) memory device configured to execute firmware code loaded from the phone image section, the firmware code configured to perform a file access procedure to access the persistent files stored in the non-XIP flash memory device by skipping bad blocks indicated by the access directory and without copying the persistent files to another memory device.

20. A cellular telephone in accordance with claim 19 wherein the firmware code is configured to execute the steps of:

determining a file location of a persistent file within the persistent file section based on file location data within an access directory;

comparing current pages of the non-XIP flash memory device to bad block page numbers within a bad block table of the access directory; and reading the persistent files while skipping the bad blocks indicated by the bad block page numbers.

* * * * *